US011073853B2

(12) United States Patent
Chen et al.

(10) Patent No.: US 11,073,853 B2
(45) Date of Patent: Jul. 27, 2021

(54) POWER SUPPLY WITH LOW VARIATION OF TOTAL RADIATED POWER

(71) Applicant: RichWave Technology Corp., Taipei (TW)

(72) Inventors: Chih-Sheng Chen, Taipei (TW); Chia-Jung Yeh, Taipei (TW)

(73) Assignee: RichWave Technology Corp., Taipei (TW)

(*) Notice: Subject to any disclaimer, the term of this patent is extended or adjusted under 35 U.S.C. 154(b) by 319 days.

(21) Appl. No.: 15/792,786

(22) Filed: Oct. 25, 2017

(65) Prior Publication Data
US 2018/0299915 A1   Oct. 18, 2018

(30) Foreign Application Priority Data
Apr. 18, 2017  (TW) .................................. 106112865

(51) Int. Cl.
*G05F 1/56*  (2006.01)
*H03F 3/345*  (2006.01)
*G05F 1/575*  (2006.01)
*H02M 3/335*  (2006.01)
*H03F 1/02*  (2006.01)
*H03F 3/195*  (2006.01)
*H02M 1/00*  (2006.01)

(52) U.S. Cl.
CPC .............. *G05F 1/561* (2013.01); *G05F 1/575* (2013.01); *H02M 3/33523* (2013.01); *H03F 1/0211* (2013.01); *H03F 3/195* (2013.01); *H03F 3/345* (2013.01); *H02M 2001/0022* (2013.01); *H03F 2200/451* (2013.01)

(58) Field of Classification Search
None
See application file for complete search history.

(56) References Cited

U.S. PATENT DOCUMENTS

| 2006/0002154 A1 | 1/2006 | Amrani | |
| 2012/0187927 A1* | 7/2012 | Yu | G05F 1/575 323/271 |
| 2013/0049725 A1* | 2/2013 | Yashiki | H02M 3/1563 323/282 |

FOREIGN PATENT DOCUMENTS

| CN | 101087071 A | 12/2007 |
| CN | 101145733 A | 3/2008 |
| CN | 102147629 A | 8/2011 |
| CN | 105811755 A | 7/2016 |
| CN | 106160464 A | 11/2016 |

(Continued)

Primary Examiner — Jue Zhang
Assistant Examiner — Henry E Lee, III
(74) Attorney, Agent, or Firm — Winston Hsu

(57) ABSTRACT

A power supply includes a voltage regulator, a transistor, a current-to-voltage transform circuit, and a comparator. The voltage regulator receives a control signal, a source voltage, and a control voltage, and outputs a supply voltage according to the control voltage and the control signal. The transistor has a first terminal receiving the source voltage, and a control terminal coupled to the voltage regulator. The current-to-voltage transform circuit has a first terminal coupled to a second terminal of the transistor, a second terminal for receiving a reference voltage. The comparator has a first input terminal for receiving a comparison signal, a second input terminal coupled to the first terminal of the current-to-voltage transform circuit, and an output terminal for outputting the control voltage.

20 Claims, 6 Drawing Sheets

(56) References Cited

FOREIGN PATENT DOCUMENTS

| | | |
|---|---|---|
| TW | 201122755 A1 | 7/2011 |
| TW | 201504785 A | 2/2015 |
| TW | 201514650 A | 4/2015 |
| TW | 201624892 A | 7/2016 |

* cited by examiner

POWER SUPPLY WITH LOW VARIATION OF TOTAL RADIATED POWER

CROSS REFERENCE TO RELATED APPLICATION

This application claims priority of Taiwan application No. 106112865, which was filed on Apr. 18, 2017, and is included herein by reference.

TECHNICAL FIELD

This invention is related to a power supply, especially related to a power supply capable of adjusting the output voltage to reduce the variation of total radiated power according to the output current.

BACKGROUND

In prior art, during the operation of radio frequency (RF) power amplifier, the output impedance may become mismatched when the frequency of the RF signal varies due to the characteristics of the antenna or the circuit. In this case, the total radiated power (TRP) may also change due to mismatched impedance.

To reduce the variation of total radiated power to maintain the output efficiency of the power amplifier, the prior art adopts directional couplers to sense the output current of the power amplifier, and controls the power amplifier according to the sensing result. However, the directional coupler requires greater area, and is difficult to be built inside of the power amplifier. In addition, when sensing the output current to control the power amplifier, the feedback path must be designed to have enough bandwidth so as to control the power amplifier effectively. Therefore, when adopting the directional coupler, it would be difficult to reduce the area and make the routing between circuits complicate.

SUMMARY

One embodiment of the present invention discloses a power supply. The power supply includes a voltage regulator, a transistor, a current-to-voltage transform circuit, and a comparator.

The voltage regulator receives a control signal, a source voltage, and a control voltage, and outputs a supply voltage according to the control voltage and/or the control signal. The transistor has a first terminal for receiving the source voltage, a second terminal, and a control terminal coupled to the voltage regulator. The current-to-voltage transform circuit has a first terminal coupled to a second terminal of the transistor, and a second terminal for receiving a reference voltage. The comparator has a first input terminal for receiving a comparison signal, a second input terminal coupled to the first terminal of the current-to-voltage transform circuit, and an output terminal for outputting the control voltage.

Another embodiment of the present invention discloses a method for operating a power supply. The power supply includes a voltage regulator, a transistor, a current-to-voltage transform circuit, and a comparator. The voltage regulator includes a transform circuit.

The method includes the voltage regulator outputting a supply voltage according to a control signal and a feedback signal, the transistor outputting a reference supply current according to the supply voltage, the current-to-voltage transform circuit receiving the reference supply current to generate a reference supply voltage, the comparator outputting a control voltage according to a comparison signal and the reference supply voltage, and the transform circuit of the voltage regulator outputting the feedback signal according to at least the control voltage and the supply voltage.

DETAILED DESCRIPTION

Figure 1:
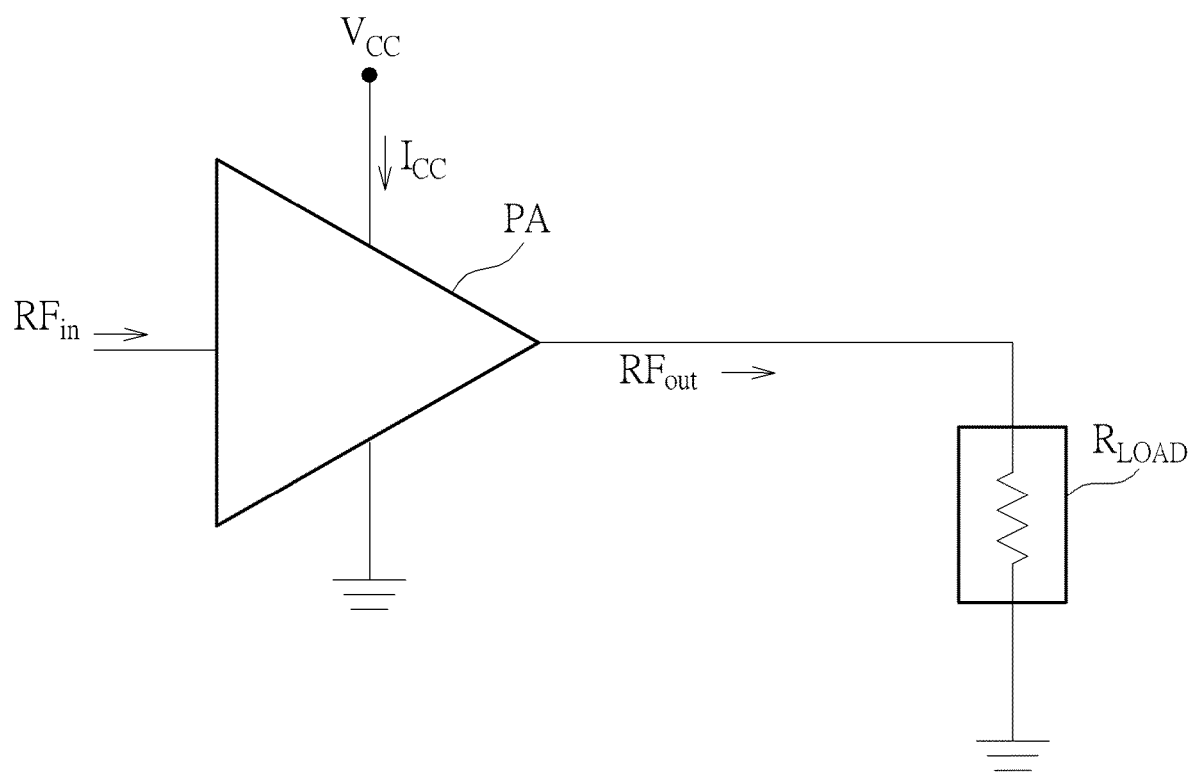
FIG. 1 shows a power amplifier according to one embodiment of the present invention.

Below, exemplary embodiments will be described in detail with reference to accompanying drawings so as to be easily realized by a person having ordinary knowledge in the art. The inventive concept maybe embodied in various forms without being limited to the exemplary embodiments set forth herein. Descriptions of well-known parts are omitted for clarity, and like reference numerals refer to like elements throughout.

FIG. 1 shows a power amplifier PA according to one embodiment of the present invention. The power amplifier PA can generate the radio frequency output signal $RF_{out}$ by amplifying the radio frequency input signal $RF_{in}$. The power amplifier PA can be a collector-voltage-controlled amplifier. That is, the output power of the power amplifier PA can be controlled by the received collector voltage $V_{CC}$. Generally, the output power P of a collector-voltage-controlled amplifier can be represented as equation (1):

$$P = \frac{(2 \times V_{CC} - V_{SAT})^2}{8 \times R_{LOAD} \times 10^{-3}} \qquad \text{equation (1)}$$

$V_{CC}$ represents the collector voltage received by the power amplifier PA, and can be provided by external power supply circuits. $V_{SAT}$ represents the smallest operation voltage of the internal transistor of the power amplifier PA, and is a fixed value. $R_{LOAD}$ represents the external output impedance of the power amplifier PA. In equation (1), if the fixed value is ignored, since the collector voltage $V_{CC}$ has a power of two, the collector voltage $V_{CC}$ dominates the external output impedance $R_{LOAD}$. In other words, the variation of the output power P is mainly related to the variation of the collector voltage $V_{CC}$. Therefore, by observing the variation of the collector voltage $V_{CC}$, the trend of the variation of the output power P can also be captured.

Furthermore, the output power P can also be represented as equation (2):

$$P = V_{CC} \times I_{CC} \times \eta \qquad \text{equation (2)}$$

$I_{CC}$ represents the collector current received by the power amplifier PA, and $\eta$ is the efficiency factor of the power amplifier PA. Assuming the efficiency factor $\eta$ of the power amplifier PA to be fixed, the linear relation between the collector current $I_{CC}$ and the collector voltage $V_{CC}$ can be observed from equation (1) and equation (2). That is, by observing the variation of the collector current $I_{CC}$, the trend of the variation of the collector voltage $V_{CC}$ can also be derived.

In some embodiments, the power supply providing the collector voltage $V_{CC}$ and the collector current $I_{CC}$ for the power amplifier PA can adjust the collector voltage $V_{CC}$ by sensing the outputted collector current $I_{CC}$, allowing the power amplifier PA to reduce the variation of the total radiated power.

Figure 2:
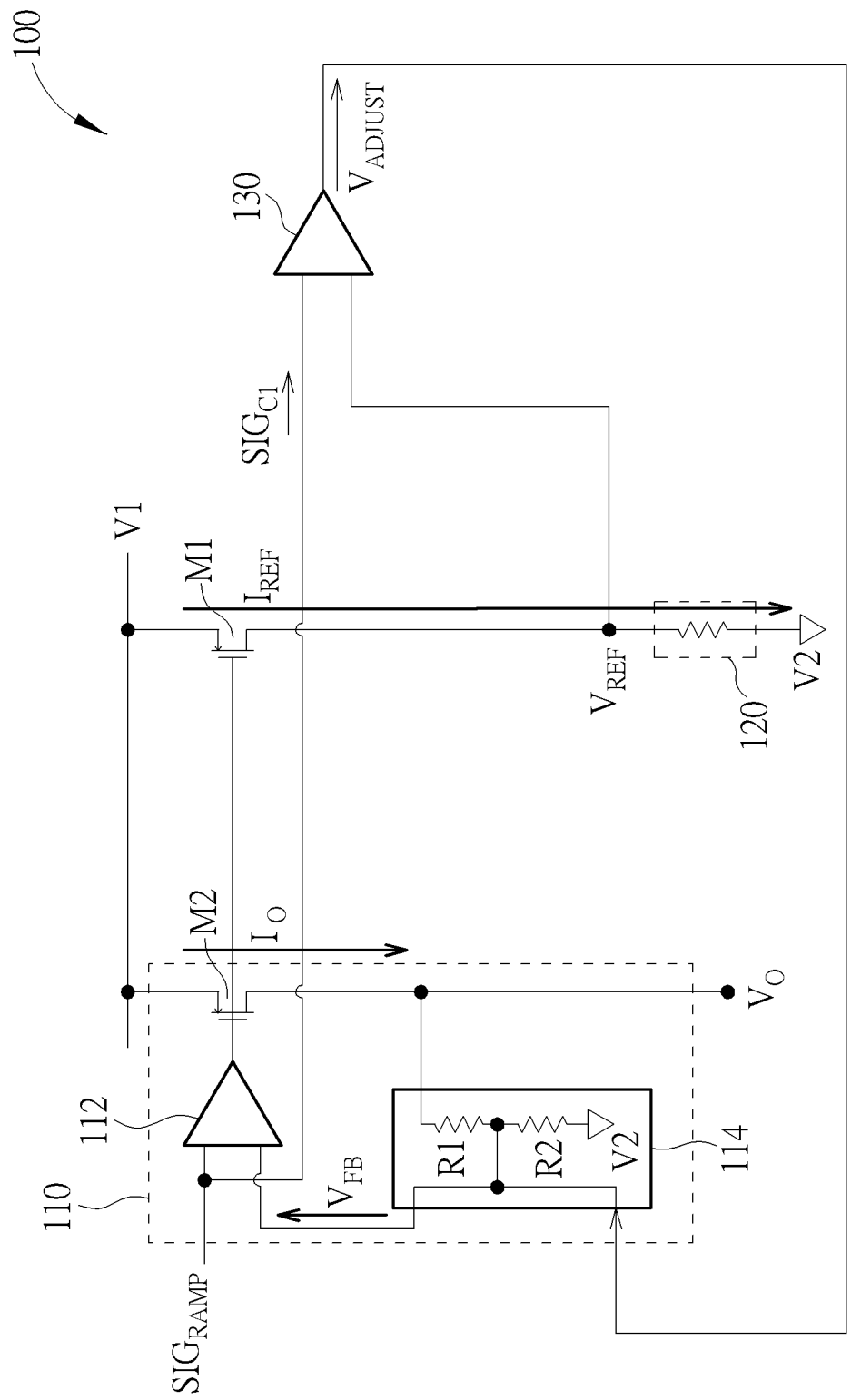
FIG. 2 shows a power supply according to one embodiment of the present invention.

FIG. 2 shows the power supply 100 according to one embodiment of the present invention. The power supply 100 includes a voltage regulator 110, a first transistor M1, a current-to-voltage transform circuit 120, and a first comparator 130. In some embodiments, the voltage regulator 110 can be a low dropout regulator (LDO regulator).

The voltage regulator 110 can receive a control signal $SIG_{RAMP}$, a source voltage V1, and a first control voltage $V_{ADJUST}$, and can output a supply voltage $V_O$ according to the first control voltage $V_{ADJUST}$ and/or the control signal $SIG_{RAMP}$. The first transistor M1 has a first terminal, a second terminal, and a control terminal. The first terminal of the first transistor M1 can receive the source voltage V1, and the control terminal of the first transistor M1 is coupled to the voltage regulator 110. The current-to-voltage transform circuit 120 has a first terminal and a second terminal. The second terminal of the current-to-voltage transform circuit 120 can receive a reference voltage V2. The reference voltage V2 can be the system ground voltage, the voltage of the system common terminal, or the voltage of the return terminal. The current-to-voltage transform circuit 120 can receive the current $I_{REF}$ outputted from the first transistor M1, and transform the current $I_{REF}$ into voltage signal. In some embodiments, the current-to-voltage transform circuit 120 can be a resistor. The first comparator 130 has a first input terminal, a second input terminal, and an output terminal. The first input terminal of the first comparator 130 can receive a first comparison signal $SIG_{C1}$, the second input terminal of the first comparator 130 is coupled to the first terminal of the current-to-voltage transform circuit 120, and the output terminal of the first comparator 130 can output the first control voltage $V_{ADJUST}$. In some embodiments, the control signal $SIG_{RAMP}$ and the first comparison signal $SIG_{C1}$ can have variable voltages. In some embodiments, the first comparison signal $SIG_{C1}$ can be provided by external circuits or can be substantially the same signal as the control signal $SIG_{RAMP}$. In FIG. 2, the first input terminal of the first comparator 130 can be coupled to the input terminal of the voltage regulator 110, so the first input terminal of the first comparator 130 can receive the control signal $SIG_{RAMP}$ as the first comparator signal $SIG_{C1}$.

In FIG. 2, the voltage regulator 110 can include a first amplifier 112, a second transistor M2, and a first transform circuit 114. The first amplifier 112 has a first input terminal, a second input terminal and an output terminal. The first input terminal of the first amplifier 112, coupled to the first input terminal of the first comparator 130, can receive the control signal $SIG_{RAMP}$. The second transistor M2 has a first terminal, a second terminal, and a control terminal. The first terminal of the second transistor M2 can receive the source voltage V1, the second terminal of the second transistor M2 can output the supply voltage $V_O$, and the control terminal of the second transistor M2 is coupled to the output terminal of the first amplifier 112. The first transform circuit 114 is coupled to the second input terminal of the first amplifier 112 and the output terminal of the first comparator 130, and the first transform circuit 114 can output a feedback signal $V_{FB}$ to adjust the voltage at the second input terminal of the first amplifier 112 according to the first control voltage $V_{ADJUST}$ so as to adjust the supply voltage $V_O$ outputted from the voltage regulator 110.

In some embodiments, the first transform circuit 114 provides a transfer function H(s) in the closed loop of the voltage regulator 110. For example, the first transform circuit 114 can include resistors R1 and R2 coupled in series for forming a voltage divider. A first terminal of the voltage divider, i.e. the first terminal of the resistor R1, is coupled to the second terminal of the second transistor M2. An intermediate terminal of the voltage divider, i.e. a second terminal of the resistor R1, is coupled to the first terminal of the resistor R2, the second input terminal of the first amplifier 112 and the output terminal of the first comparator 130. A second terminal of the voltage divider, i.e. a second terminal of the resistor R2, can receive a reference voltage V2. In some embodiments, the feedback signal $V_{FB}$ can be a feedback voltage.

Figure 3:
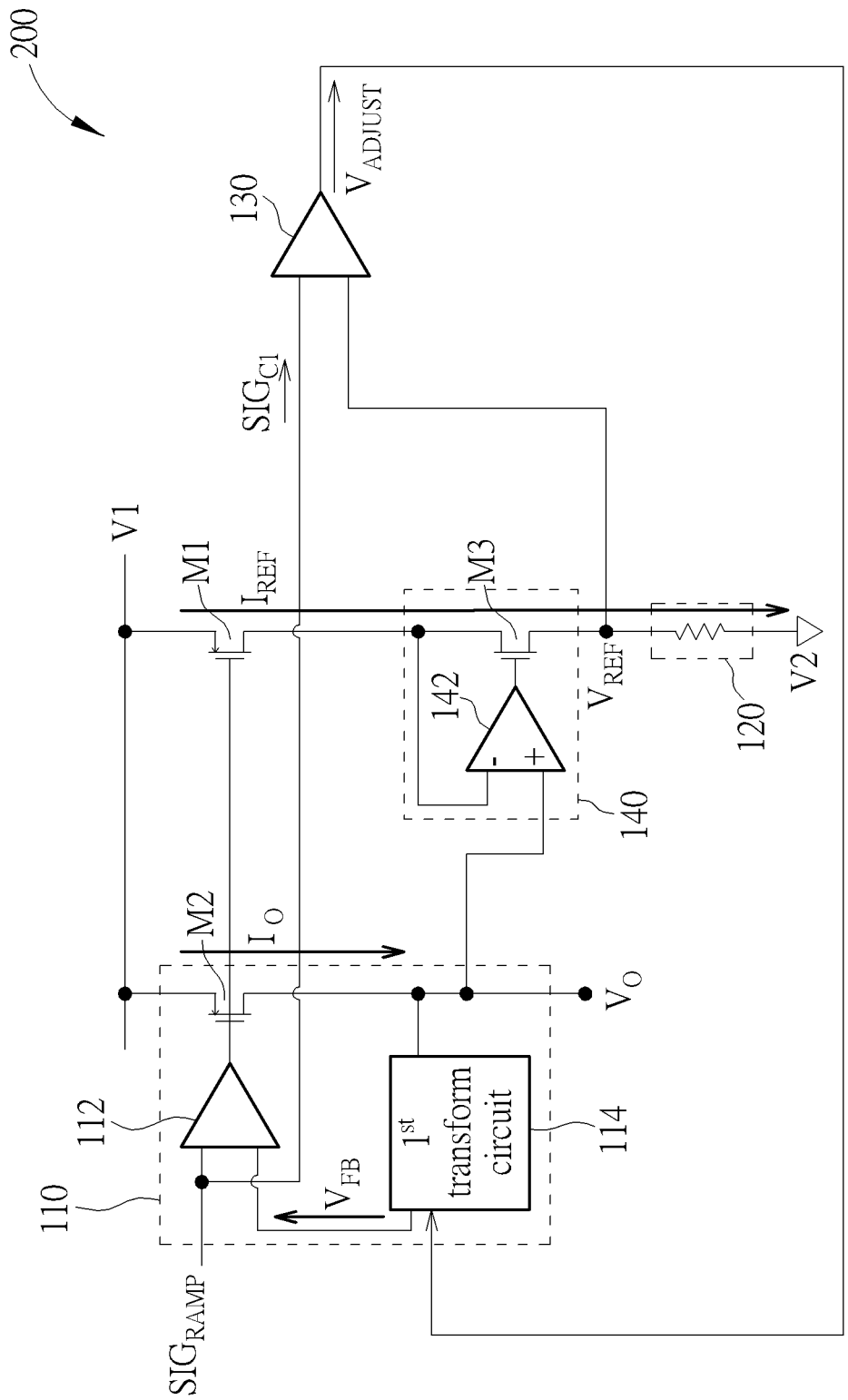
FIG. 3 shows a power supply according to another embodiment of the present invention.

FIG. 3 shows a power supply 200 according to one embodiment of the present invention. The power supply 200 and the power supply 100 have similar structures and can be operated with similar principles. The main difference between these two is in that the power supply 200 can further include a voltage stabilization circuit 140. The voltage stabilization circuit 140 is coupled to the second terminal of the first transistor M1 and the second terminal of the second transistor M2, and the second terminal of the first transistor M1 can be coupled to the first terminal of the current-to-voltage transform circuit 120 through the voltage stabilization circuit 140. In some embodiments, the voltage stabilization circuit 140 can include a second amplifier 142 and a third transistor M3. The second amplifier 142 has a first input terminal, a second input terminal, and an output terminal. The first input terminal of the second amplifier 142 is coupled to the second terminal of the second transistor M2, and the second input terminal of the second amplifier 142 is coupled to the second terminal of the first transistor M1. The third transistor M3 has a first terminal, a second terminal, and a control terminal. The first terminal of the third transistor M3 is coupled to the second terminal of the first transistor M1, the second terminal of the third transistor M3 is coupled to the first terminal of the current-to-voltage transform circuit 120, and the control terminal of the third transistor M3 is coupled to the output terminal of the second amplifier 142. With the voltage stabilization circuit 140, the voltage at the second terminal of the first transistor M1 and the voltage at the second terminal of the second transistor M2 can be substantially the same.

However, in some embodiments, the voltage stabilization circuit 140 can be removed as shown in FIG. 2 according to the system requirement, or the voltage stabilization circuit 140 can be implemented by a different circuit capable of keeping the voltage at the second terminal of the first transistor M1 and the voltage at the second terminal of the second transistor M2 to be substantially the same.

In addition, in FIGS. 2 and 3, the control terminal of the first transistor M1 can also be coupled to the control terminal of the second transistor M2. That is, the three terminals of the first transistor M1 will receive the same voltages as the three terminals of the second terminals M2, so the two transistors can be operated in the same status. In other words, the current $I_{REF}$ of the first transistor M1 and the current $I_O$ of the second transistor M2 can vary simultaneously, and by sensing the current $I_{REF}$ of the first transistor M1, the status of the current $I_O$ of the second transistor M2 can be known. According to the equation (1) and equation (2), when using the power supplies 100 and 200 to provide the supply voltage $V_O$ as the collector voltage $V_{CC}$ for the power amplifier PA, the current $I_O$ of the second transistor M2, that is, the collector current $I_{CC}$ of the power amplifier PA, is related to the supply voltage $V_O$. Therefore, the voltage signal derived by the current-to-voltage transform circuit 120 according to the current $I_{REF}$ flowing through the first transistor M1 can be the reference supply voltage $V_{REF}$ related to the supply voltage $V_O$.

Since the output current $I_O$ of the second transistor M2 is mainly used by external circuits, the output current $I_O$ may be rather high. However, the current $I_{REF}$ of the first transistor M1 is mainly used for sensing, so the current $I_{REF}$ can be rather low. Therefore, in some embodiments, the channel width-to-length ratio of the second transistor M2 can be greater than the channel width-to-length ratio of the first transistor M1, reducing the area required by the power supplies 100 and 200.

With the current-to-voltage transform circuit 120, the current outputted from the first transistor M1 can be transformed into the reference supply voltage $V_{REF}$ properly so that the first comparator 130 can compare the voltage at the first terminal of the current-to-voltage transform circuit 120 with the voltage of the first comparison signal $SIG_{C1}$ (or the control signal $SIG_{RAMP}$) to determine whether to adjust the first control voltage $V_{ADJUST}$. In other words, in some embodiments of the present invention, the designer may learn the relation between the first control voltage $V_{ADJUST}$ and the voltage outputted by the current-to-voltage transform circuit 120 from simulation or experiment, and make the first comparator 130 output the first control signal $V_{ADJUST}$ to the first transform circuit 114 to adjust the supply voltage $V_O$ when the voltage at the first terminal of the current-to-voltage transform circuit 120 is greater or smaller than threshold voltage corresponding to the first comparison signal $SIG_{C1}$ (or the control signal $SIG_{RAMP}$).

For example, to avoid the power supplies 100 and 200 from outputting unnecessary excessive power, the first comparator 130 can output the first control voltage $V_{ADJUST}$ to the first transform circuit 114 to lower the supply voltage $V_O$ when the reference voltage $V_{REF}$ is greater than the first comparison signal $SIG_{C1}$ (or the control signal $SIG_{RAMP}$).

In addition, to ensure that the first comparator 130 can compare the voltage at the first terminal of the current-to-voltage transform circuit 120 with the voltage of the control signal $SIG_{RAMP}$ precisely according to the simulation result or the experiment result, the power supplies 100 and 200 can further adopt a transform circuit to adjust the voltage of the control signal $SIG_{RAMP}$ received by the first comparator 130 in some embodiments, so that the voltages at the first input terminal and the second input terminal of the first comparator 130 can be within a proper and similar regions for improving the comparison accuracy.

Figure 4:
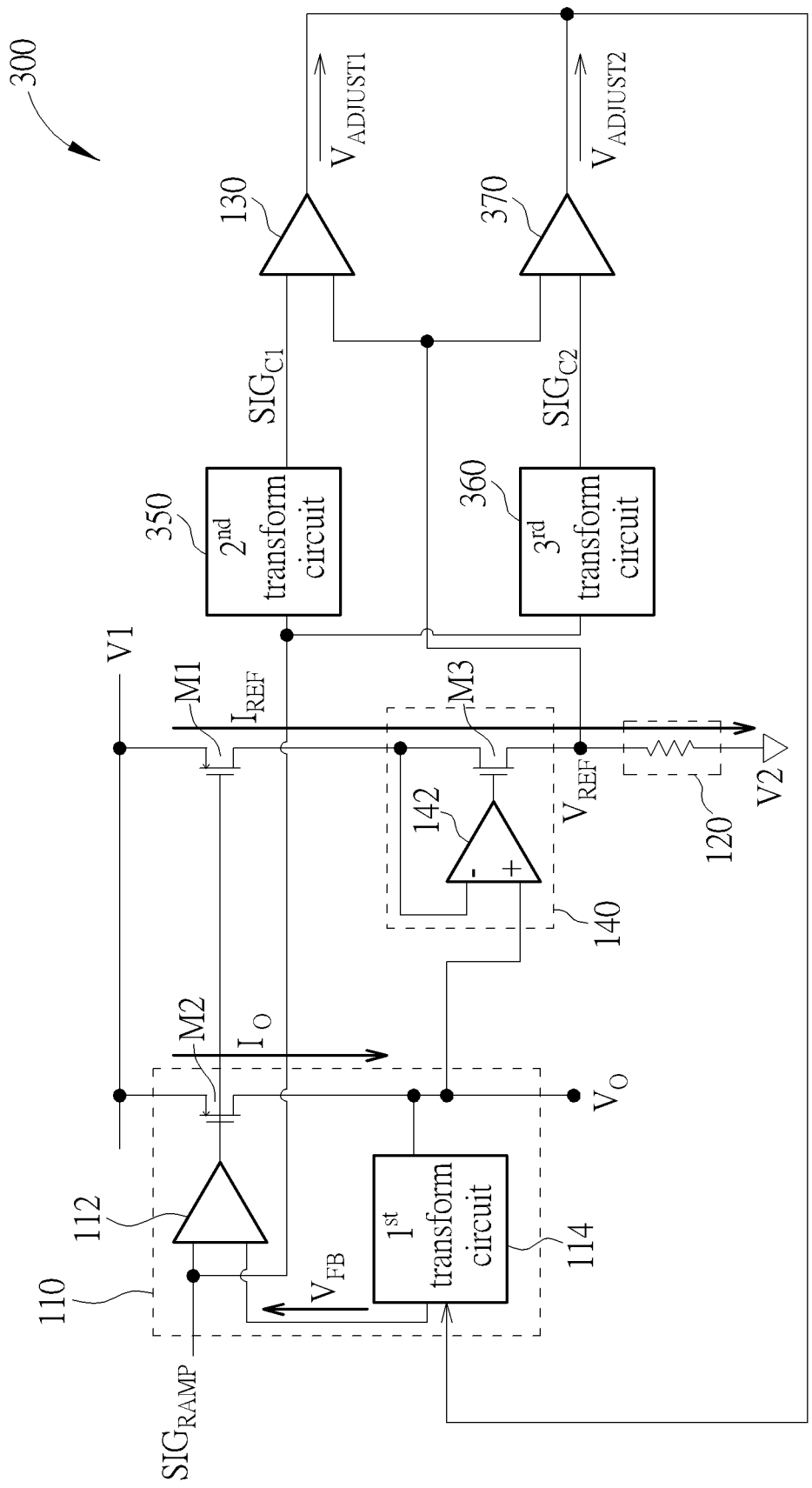
FIG. 4 shows a power supply according to another embodiment of the present invention.

FIG. 4 shows a power supply 300 according to one embodiment of the present invention. The power supply 300 and the power supply 200 may have the similar structures and similar operation principles. However, the power supply 300 may further include a second transform circuit 350, a third transform circuit 360, and a second comparator 370.

The second transform circuit 350 is coupled between the first input terminal of the first comparator 130 and the first input terminal of the first amplifier 112, and the second transform circuit 350 can receive the control signal $SIG_{RAMP}$ and output the first comparison signal $SIG_{C1}$ according to the control signal $SIG_{RAMP}$. The first comparator 130 can output the first control voltage $V_{ADJUST1}$ according to the voltage at the first terminal of the current-to-voltage circuit 120 and the first comparison signal $SIG_{C1}$. In some embodiments, the second transform circuit 350 can include a transmission line or a resistor.

The third transform circuit 360 can receive the control signal $SIG_{RAMP}$ and adjust the control signal $SIG_{RAMP}$ to output the second comparison signal $SIG_{C2}$. The second comparator 370 has a first input terminal, a second input terminal, and an output terminal. The first input terminal of the second comparator 370 is coupled to the first terminal of the current-to-voltage transform circuit 120, the second input terminal of the second comparator 370 is coupled to the third transform circuit 360 to receive the second comparator signal $SIG_{C2}$, and the output terminal of the second comparator 370 can output the second control voltage $V_{ADJUST2}$ according to the voltage at the first terminal of the current-to-voltage transform circuit 120 and the second comparison signal $SIG_{C2}$. In some embodiments, the third transform circuit 360 can include a transmission line or a resistor.

In addition, the first transform circuit 114 is coupled to the first comparator 130 and the second comparator 370, and the first transform circuit 114 can adjust the voltage at the second input terminal of the second comparator 112 according to the first control voltage $V_{ADJUST1}$ and the second control voltage $V_{ADJUST2}$ so as to adjust the supply voltage $V_O$ of the power supply 300.

In some embodiments, the second transform circuit 350 can increase the voltage of the control signal $SIG_{RAMP}$ by a predetermined percentage to output the first comparison signal $SIG_{C1}$, and the third transform circuit 360 can decrease the voltage of the control signal $SIG_{RAMP}$ by a predetermined percentage to output the second comparison signal $SIG_{C2}$. In this case, the first comparator 130 can output the first control voltage $V_{ADJUST1}$ to the first transform circuit 114 to decrease the supply voltage $V_O$ when the voltage at the first terminal of the current-to-voltage circuit 120 is greater than the upper limit of the control signal $SIG_{RAMP}$, that is, greater than the first comparison signal $SIG_{C1}$. Also, in contrast, the second comparator 370 can output the second control voltage $V_{ADJUST2}$ to the first transform circuit 114 to increase the supply voltage $V_O$ when the voltage at the first terminal of the current-to-voltage circuit 120 is smaller than the lower limit of the control signal $SIG_{RAMP}$, that is, smaller than the second comparison signal $SIG_{C2}$. Consequently, no matter the power supply 300 is outputting too much power or too little power, the supply voltage can be adjusted instantly by adjusting the voltage at the second input terminal of the first comparator 112.

In some embodiments, the power supplies 100, 200, and 300 can output the supply voltage $V_O$ to a signal amplification element, so the signal amplification element can amplify the RF input signal to generate the RF output signal according to the supply voltage $V_O$. For example, the supply voltage $V_O$ outputted by the power supplies 100, 200, and 300 can be used by the power amplifier PA as the collector voltage $V_{CC}$ as shown in FIG. 1. Since the power supplies 100, 200, and 300 can duplicate the output current flowing to the external circuit and sense the duplicated current, the power supplies 100, 200, and 300 can adjust the supply voltage according to the sensing result by omitting directional couplers. Therefore, the variation of the output power can be reduced while the required chip area can be reduced and the complicated circuit design can be simplified. Furthermore, the first comparator 130 and the second comparator 370 can be implemented by field-effect transistors so the input/output signals can be voltage-based, avoiding additional currents and reducing power consumption.

Figure 5:
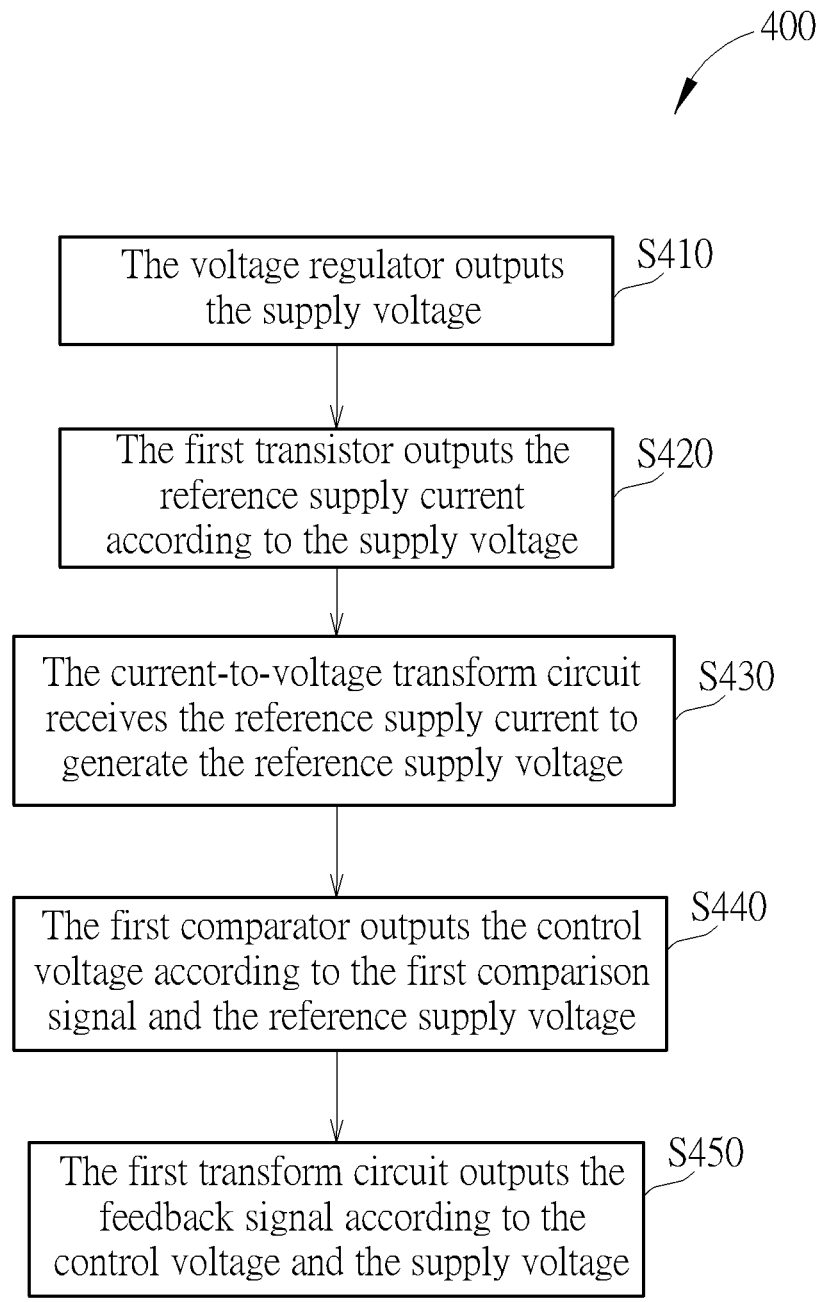
FIG. 5 shows a flow chart of a method for operating the power supply in FIG. 2 or FIG. 3.

FIG. 5 shows the flow chart of the method 400 for operating the power supply 100 or 200 according to one embodiment of the present invention. The method 400 includes steps S410 to S450.

S410: the voltage regulator 110 outputs the supply voltage $V_O$ according to the control signal $SIG_{RAMP}$ and the feedback signal $V_{FB}$;

S420: the first transistor M1 outputs the reference supply current $I_{REF}$ according to the supply voltage $V_O$;

S430: the current-to-voltage transform circuit 120 receives the reference supply current $I_{REF}$ to generate the reference supply voltage $V_{REF}$;

S440: the first comparator 130 outputs the control voltage $V_{ADJUST}$ according to the first comparison signal $SIG_{C1}$ and the reference supply voltage $V_{REF}$;

S450: the first transform circuit 114 outputs the feedback signal $V_{FB}$ according to the control voltage $V_{ADJUST}$ and the supply voltage $V_O$.

With method 400, the power supply 100 and 200 can duplicate the output current flowing to the external circuit, sense the duplicated current, and adjust the supply voltage according to the sensing result by omitting directional couplers. Therefore, the variation of the output power can be reduced while the required chip area can be reduced and the complicated circuit design can be simplified.

Figure 6:
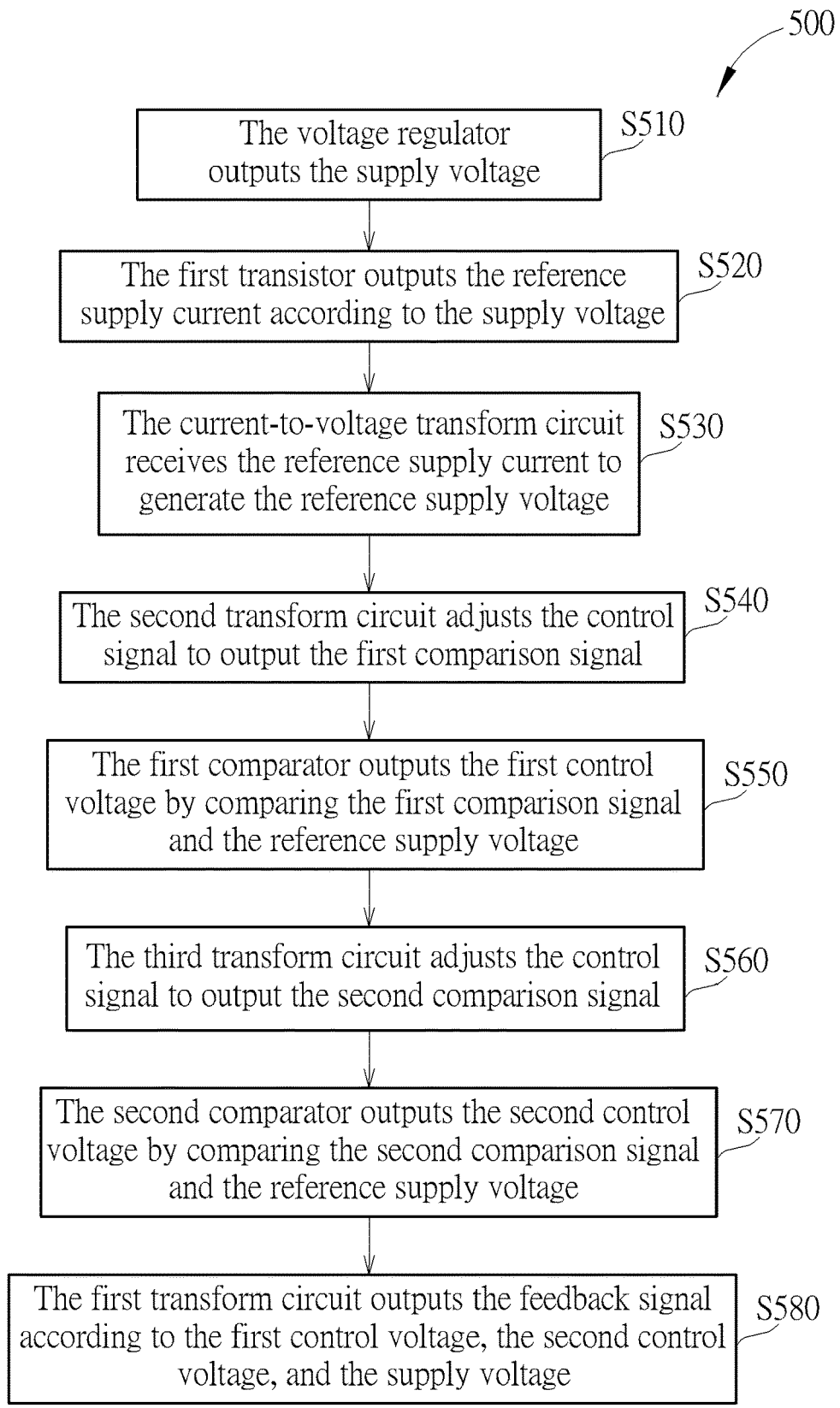
FIG. 6 shows a flow chart of a method for operating the power supply in FIG. 4.

FIG. 6 shows the flow chart of the method 500 for operating the power supply 300 according to one embodiment of the present invention. The method 500 includes steps S510 to S580.

S510: the voltage regulator 110 outputs the supply voltage $V_O$ according to the control signal $SIG_{RAMP}$ and a feedback signal $V_{FB}$;

S520: the first transistor M1 outputs the reference supply current $I_{REF}$ according to the supply voltage $V_O$;

S530: the current-to-voltage transform circuit 120 receives the reference supply current $I_{REF}$ to generate the reference supply voltage $V_{REF}$;

S540: the second transform circuit 350 adjusts the control signal $SIG_{RAMP}$ to output the first comparison signal $SIG_{C1}$;

S550: the first comparator 130 outputs the first control voltage $V_{ADJUST1}$ by comparing the first comparison signal $SIG_{C1}$ and the reference supply voltage $V_{REF}$;

S560: the third transform circuit 360 adjusts the control signal $SIG_{RAMP}$ to output the second comparison signal $SIG_{C2}$;

S570: the second comparator 370 outputs the second control voltage $V_{ADJUST2}$ by comparing the second comparison signal $SIG_{C2}$ and the reference supply voltage $V_{REF}$; and S580: the first transform circuit 114 outputs the feedback signal $V_{FB}$ according to the first control voltage $V_{ADJUST1}$, the second control voltage $V_{ADJUST2}$, and the supply voltage $V_O$.

In some embodiments, the second transform circuit 350 can increase the voltage of the control signal $SIG_{RAMP}$ by a predetermined percentage to output the first comparison signal $SIG_{C1}$, and the third transform circuit 360 can decrease the voltage of the control signal $SIG_{RAMP}$ by a predetermined percentage to output the second comparison signal $SIG_{C2}$. In this case, the first comparator 130 can output the first control voltage $V_{ADJUST1}$ to the first transform circuit 114 to decrease the supply voltage $V_O$ when the reference supply voltage $V_{REF}$ is greater than the voltage of the first comparison signal $SIG_{C1}$. Also, in contrast, the second comparator 370 can output the second control voltage $V_{ADJUST2}$ to the first transform circuit 114 to increase the supply voltage $V_O$ when the reference supply voltage $V_{REF}$ is smaller than the second comparison signal $SIG_{C2}$.

With method 500, the power supply 300 can duplicate the output current flowing to the external circuit, sense the duplicated current, and adjust the supply voltage according to the sensing result by omitting directional coupler. Therefore, the variation of the output power can be reduced while the required chip area can be reduced and the complicated circuit design can be simplified. Also, the supply voltage can be adjusted instantly, preventing the power supply 300 from outputting too much or too little power.

In summary, the power supply and the method for operating the power supply provided by the embodiments of the present invention can duplicate the output current flowing to the external circuit, sense the duplicated current, and adjust the supply voltage according to the sensing result without using any directional coupler. Therefore, the variation of the output power can be reduced while reducing the required chip area and simplifying the complicate circuit design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power supply comprising:
   a voltage regulator configured to receive a control signal, a source voltage, and a first control voltage, and output a supply voltage according to at least one of the first control voltage and the control signal;
   a first transistor having a first terminal configured to receive the source voltage, a second terminal, and a control terminal coupled to the voltage regulator, the first transistor being configured to generate a reference supply current according to the supply voltage;
   a current-to-voltage transform circuit having a first terminal coupled to the second terminal of the first transistor for receiving the reference supply current, and a second terminal configured to receive a reference voltage, the current-to-voltage transform circuit being configured to generate a reference supply voltage according to the reference supply current; and
   a first comparator having a first input terminal configured to receive a first comparison signal, a second input terminal coupled to the first terminal of the current-to-voltage transform circuit for receiving the reference supply voltage, and an output terminal configured to output the first control voltage.

2. The power supply of claim 1, wherein the voltage regulator comprising:
   a first amplifier having a first input terminal configured to receive the control signal, a second input terminal, and an output terminal;
   a second transistor having a first terminal configured to receive the source voltage, a second terminal configured to output the supply voltage, and a control terminal coupled to the output terminal of the first amplifier; and
   a first transform circuit coupled to the second input terminal of the first amplifier and the output terminal of the first comparator, and configured to adjust a voltage of the second input terminal of the first amplifier according to the first control voltage;
   wherein the control terminal of the first transistor is coupled to the control terminal of the second transistor.

3. The power supply of claim 2, further comprising:
a voltage stabilization circuit coupled to the second terminal of the first transistor and the second terminal of the second transistor, and configured to make a voltage of the second terminal of the first transistor substantially equal to a voltage of the second terminal of the second transistor.

4. The power supply of claim 3, wherein the voltage stabilization circuit comprises:
a second amplifier having a first input terminal coupled to the second terminal of the second transistor, a second input terminal coupled to the second terminal of the first transistor, and an output terminal; and
a third transistor having a first terminal coupled to the second terminal of the first transistor, a second terminal coupled to the first terminal of the current-to-voltage transform circuit, and a control terminal coupled to the output terminal of the second amplifier.

5. The power supply of claim 2, further comprising:
a second transform circuit coupled between the first input terminal of the first comparator and the first input terminal of the first amplifier, and the second transform circuit being configured to receive and adjust the control signal to output the first comparison signal.

6. The power supply of claim 5, further comprising:
a third transform circuit configured to receive and adjust the control signal to output a second comparison signal;
a second comparator having a first input terminal coupled to the first terminal of the current-to-voltage transform circuit, a second input terminal coupled to the third transform circuit to receive the second comparison signal, and an output terminal configured to output a second control voltage;
wherein the first transform circuit is further coupled to the second comparator, and is further configured to adjust the voltage of the second input terminal of the first amplifier according to the second control voltage.

7. The power supply of claim 6, wherein the second transform circuit increases a voltage of the control signal by a predetermined percentage to output the first comparison signal, and the third transform circuit decreases the voltage of the control signal by a predetermined percentage to output the second comparison signal.

8. The power supply of claim 2, wherein the first comparator outputs the first control voltage to the first transform circuit to decrease the supply voltage when a voltage of the first terminal of the current-to-voltage transform circuit is greater than an upper limit of the control signal.

9. The power supply of claim 2, wherein a channel width-to-length ratio of the second transistor is greater than a channel width-to-length ratio of the first transistor.

10. The power supply of claim 2, wherein the supply voltage is used to supply a signal amplification element, allowing the signal amplification element to generate a radio frequency output signal by amplifying a radio frequency input signal according to the supply voltage.

11. The power supply of claim 1, wherein the first comparator is implemented by field-effect transistors.

12. The power supply of claim 1, wherein a first input terminal of the first comparator is coupled to an input terminal of the voltage regulator, and the first comparison signal and the control signal are the same.

13. The power supply of claim 2, wherein the first transform circuit comprises a voltage divider, and the voltage divider comprises:
a first terminal coupled to the second terminal of the second transistor;
an intermediate terminal coupled to the second input terminal of the first amplifier and the output terminal of the first comparator; and
a second terminal configured to receive the reference voltage.

14. A method for operating a power supply, the power supply comprising a voltage regulator, a first transistor, a current-to-voltage transform circuit, and a first comparator, the voltage regulator comprising a first transform circuit, and the method comprising:
the voltage regulator outputting a supply voltage according to a control signal and a feedback signal;
the first transistor outputting a reference supply current according to an output signal generated by the voltage regulator according to the control signal and the feedback signal;
the current-to-voltage transform circuit having a first terminal coupled to the first transistor for receiving the reference supply current and a second terminal configured to receive a reference voltage, and the current-to-voltage being configured to generate a reference supply voltage according to the reference supply current;
the first comparator having a first input terminal configured to receive a first comparison signal, a second input terminal coupled to the first terminal of the current-to-voltage transform circuit for receiving the reference supply voltage and an output terminal for outputting a first control voltage according to the first comparison signal and the reference supply voltage; and
the first transform circuit of the voltage regulator outputting the feedback signal according to at least the first control voltage and the supply voltage.

15. The method of claim 14, wherein the power supply further comprises a second transform circuit, and the method further comprises:
the second transform circuit adjusting the control signal to output the first comparison signal;
wherein the first comparator outputs the first control voltage by comparing the first comparison signal and the reference supply voltage.

16. The method of claim 15, wherein the power supply further comprises a third transform circuit and a second comparator, and the method further comprises:
the third transform circuit adjusting the control signal to output a second comparison signal; and
the second comparator outputting a second control voltage by comparing the second comparison signal and the reference supply voltage;
wherein the first transform circuit outputs the feedback signal according to the first control voltage, the second control voltage and the supply voltage.

17. The method of claim 16, wherein the second transform circuit adjusting the control signal to output the first comparison signal is the second transform circuit increasing a voltage of the control signal by a predetermined percentage to output the first comparison signal, and the third transform circuit adjusting the control signal to output the second comparison signal is the third transform circuit decreasing the voltage of the control signal by a predetermined percentage to output the second comparison signal.

18. The method of claim 17, wherein:
the first comparator outputs the first control voltage to the first transform circuit to decrease the supply voltage when the reference supply voltage is greater than a voltage of the first comparison signal; and
the second comparator outputs the second control voltage to the first transform circuit to increase the supply voltage when the reference supply voltage is smaller than a voltage of the second comparison signal.

19. The method of claim 14, wherein the first comparison signal and the control signal are the same.

20. The method of claim 14, wherein the feedback signal is a feedback voltage.

* * * * *